United States Patent
Tazawa et al.

(10) Patent No.: US 10,483,721 B2
(45) Date of Patent: Nov. 19, 2019

(54) REFLECTOR, VERTICAL CAVITY LIGHT-EMITTING DEVICE, AND METHOD OF PRODUCING THE SAME

(71) Applicant: STANLEY ELECTRIC CO., LTD., Meguro-ku, Tokyo (JP)

(72) Inventors: Komei Tazawa, Kawasaki (JP); Ji-Hao Liang, Tachikawa (JP); Seiichiro Kobayashi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 91 days.

(21) Appl. No.: 15/789,919

(22) Filed: Oct. 20, 2017

(65) Prior Publication Data
US 2018/0115140 A1    Apr. 26, 2018

(30) Foreign Application Priority Data
Oct. 24, 2016  (JP) .................. 2016-207598

(51) Int. Cl.
*H01S 5/183*  (2006.01)
*H01S 5/02*  (2006.01)
(Continued)

(52) U.S. Cl.
CPC ........ *H01S 5/18377* (2013.01); *H01L 33/105* (2013.01); *H01S 5/0206* (2013.01);
(Continued)

(58) Field of Classification Search
CPC . H01L 33/105; H01L 33/20; H01L 21/02639; H01S 5/183
See application file for complete search history.

(56) References Cited

U.S. PATENT DOCUMENTS 5,880,485 A     3/1999  Marx et al.
2008/0279241 A1*  11/2008  Oki ................. B82Y 20/00
                                    372/45.01

FOREIGN PATENT DOCUMENTS

JP    2007254258 A   10/2007

OTHER PUBLICATIONS

Extended European Search Report (EESR) dated Mar. 2, 2018 in counterpart European Application No. 17197691.3.
(Continued)

*Primary Examiner* — Michael Carter
(74) *Attorney, Agent, or Firm* — Holtz, Holtz & Volek PC

(57) ABSTRACT

A vertical cavity light-emitting device includes: a semiconductor substrate having a hexagonal crystal structure; a line mask extending linearly along at least one of a [11-20] direction and directions equivalent to the [11-20] direction on a c-plane of the semiconductor substrate; a first reflector provided on an exposed region exposed from the line mask on the c-plane of the semiconductor substrate, the first reflector comprising a high refractive index semiconductor film and a low refractive index semiconductor film having a refractive index smaller than that of the high refractive index semiconductor film, the high refractive index semiconductor film and the low refractive index semiconductor film being alternately layered; a light-emitting structure layer provided on the first reflector; and a second reflector disposed on the light-emitting structure layer so as to be opposed so the first reflector.

10 Claims, 6 Drawing Sheets

(51) Int. Cl.
    *H01L 33/10*    (2010.01)
    *H01S 5/12*     (2006.01)
    *H01L 21/02*    (2006.01)
    *H01L 33/20*    (2010.01)
    *H01S 5/125*    (2006.01)

(52) U.S. Cl.
    CPC .......... *H01S 5/0207* (2013.01); *H01S 5/1231* (2013.01); *H01L 21/02639* (2013.01); *H01L 33/20* (2013.01); *H01S 5/125* (2013.01); *H01S 5/183* (2013.01)

(56) References Cited

OTHER PUBLICATIONS

Butte, et al., "Recent Progress in the Growth of Highly Reflective Nitride-Based Distributed Bragg Reflectors and Their Use in Microcavities", Japanese Journal of Applied Physics, vol. 44, No. 10, Oct. 1, 2005, pp. 1207-7216.

Butte, et al., "Room temperature polariton lasing in III-nitride microcavities: a comparison with blue GaN-based vertical cavity surgace emitting lasers", Proceedings of SPIE, SPIE Opto: Integrated Optoelectronic Devices, Feb. 16, 2009, vol. 7216.

Ni, et al., "GaN-based vertical cavities on highly reflective and crack-free nitride distributed Bragg reflectors", Proceedings of SPIE, SPIE Opto: Integrate Optoelectronic Devices, Feb. 12, 2009, vol. 7216.

* cited by examiner

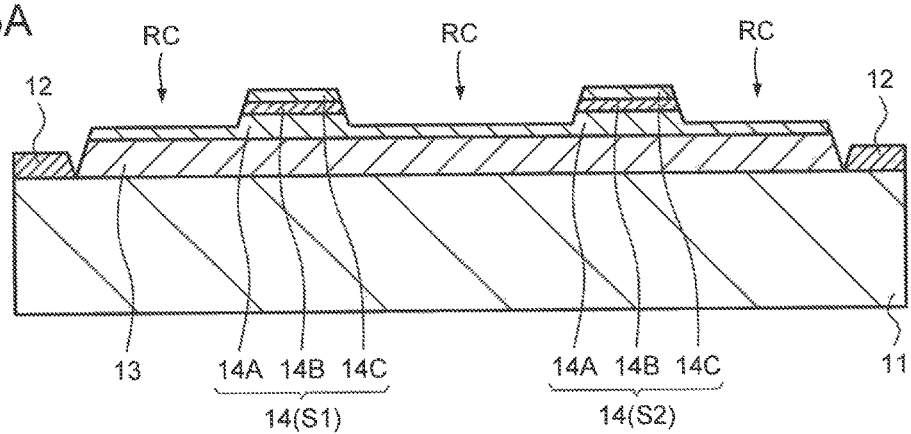
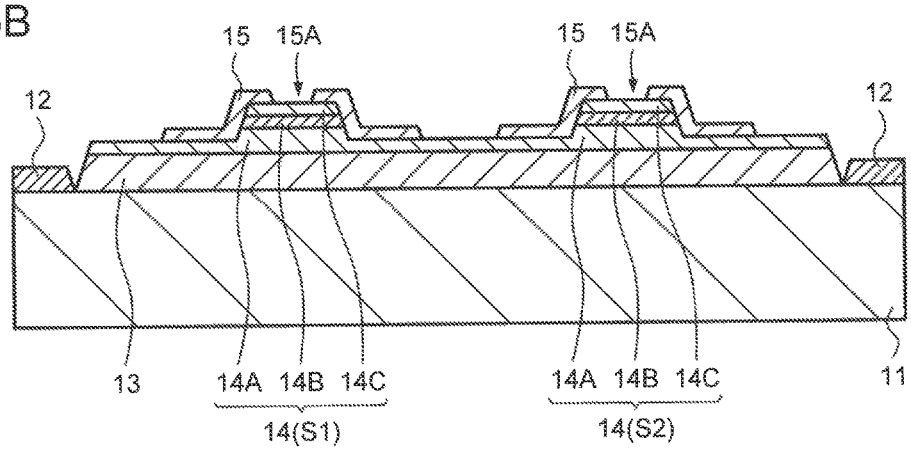
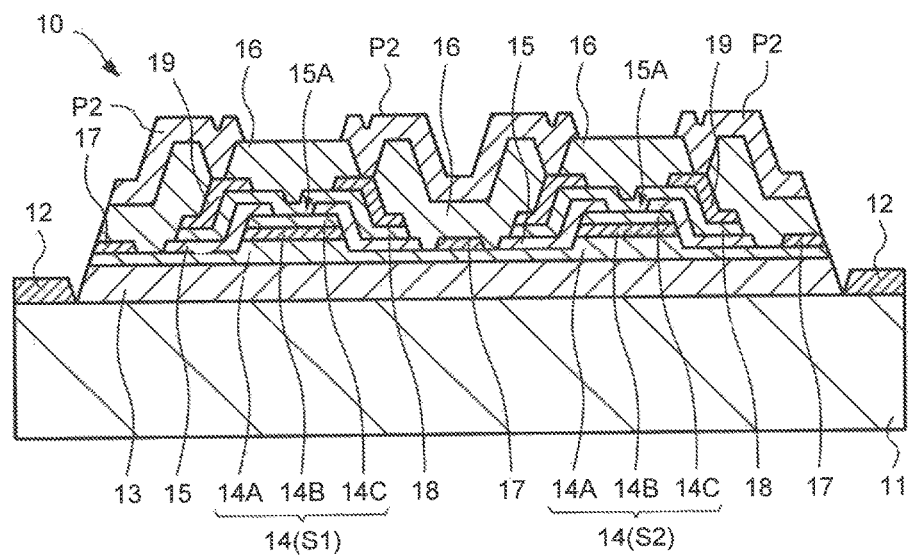

REFLECTOR, VERTICAL CAVITY LIGHT-EMITTING DEVICE, AND METHOD OF PRODUCING THE SAME

BACKGROUND OF THE INVENTION

1. Field of the Invention

The present invention relates to a reflector formed from a semiconductor multi-layer film, a vertical cavity light-emitting device such as a vertical cavity surface emitting laser (VCSEL), and a method of producing such a vertical cavity light-emitting device.

2. Description of the Related Art

A vertical cavity surface emitting laser is a semiconductor laser having a structure that resonates light vertically to a substrate surface with a reflector and outputs the light in a direction vertical to the substrate surface. For example, Patent literature 1 (Japanese Patent Application Laid-Open No. 2007-254258) discloses a surface emitting laser diode chip including a nitride semiconductor substrate and a nitride semiconductor layer formed on the nitride semiconductor substrate.

SUMMARY OF THE INVENTION

A vertical cavity light-emitting device, for example, includes reflectors opposed, to each other with a light-emitting layer interposed therebetween. The reflectors opposed to each other constitute a cavity that resonates light emitted from the light-emitting layer. Such a reflector can be produced, for example, by alternately layering two thin films having refractive indices different from each other in a plurality of times to form a multi-layer film.

A light reflectance of the reflector is determined, for example, by the refractive indices of the thin films constituting the multi-layer film and the number of the layered thin films. To obtain a desired reflectance with a smaller number of layered chin films, it is preferred to employ thin films having a large refractive index difference therebetween and to improve the film quality of each thin film.

When a multi-layer film is formed with a plurality of semiconductor films, for example, a refractive index difference can be obtained by adjusting compositions of the respective semiconductor films. When the semiconductor films having different compositions are grown, however, strain is generated between the semiconductor films. Consequently, cracks may be developed in the multi-layer film, i.e., in the reflector, thus failing to obtain a designed reflectance. Moreover, an increase in the number of layered semiconductor films leads to deterioration in productivity such as an increase in production time.

The present invention has been made in view of the aforementioned problems. It is an object of the present invention to provide a reflector formed from high-quality semiconductor films, a high-performance vertical cavity light-emitting device including such a reflector, and a method of producing such a vertical cavity light-emitting device.

According to one aspect of the present invention, a vertical cavity light-emitting device includes: a semiconductor substrate having a hexagonal crystal structure; a line mask extending linearly along at least one of a [11-20] direction and directions equivalent to the [11-20] direction on a c-plane of the semiconductor substrate; a first reflector formed on an exposed region exposed from the line mask on the c-plane of the semiconductor substrate, the first reflector comprising a high refractive index semiconductor film and a low refractive index semiconductor film having a refractive index smaller than that of the nigh refractive index semiconductor film, the high refractive index semiconductor film and the low refractive index semiconductor film being alternately layered; a light-emitting structure layer formed on the first reflector; and a second reflector disposed on the light-emitting structure layer so as to be opposed to the first reflector.

According to another aspect of the present invention, a reflector includes: a semiconductor substrate having a hexagonal crystal structure; a line mask extending linearly along at least one of a [11-20] direction and directions equivalent to the [11-20] direction on a c-plane of the semiconductor substrate; and a semiconductor multi-layer film grown on an exposed region exposed from the line mask on the c-plane of the semiconductor substrate, the semiconductor multi-layer film comprising a high refractive index semiconductor film and a low refractive index semiconductor film having a refractive index smaller than, that of the high refractive index semiconductor film, the high refractive index semiconductor film and the low refractive index semiconductor film being alternately layered.

According to still another aspect of the present invention, a method of producing a vertical cavity light-emitting device includes: a step of forming a line mask extending linearly along at least one of a [11-20] direction and directions equivalent to the [11-20] direction on a c-plane of a semiconductor substrate having a hexagonal crystal structure; a step of forming a first reflector by alternately growing a high refractive index semiconductor film, and a low refractive index semiconductor film having a refractive index smaller than that of the high refractive index semiconductor film on an exposed region exposed from the line mask on the c-plane of the semiconductor substrate; a step of growing a light-emitting structure layer on the first reflector; and a step of forming a second reflector at a position on the light-emitting structure layer that is opposed to the first reflector.

BRIEF DESCRIPTION OF THE DRAWINGS

FIGS. 5A to 5C are diagrams showing the production process of the vertical cavity light-emitting device according to the first embodiment.

DETAILED DESCRIPTION OF THE INVENTION

Embodiments of the present invention will now be described below in detail.

First Embodiment

Figure 1A:
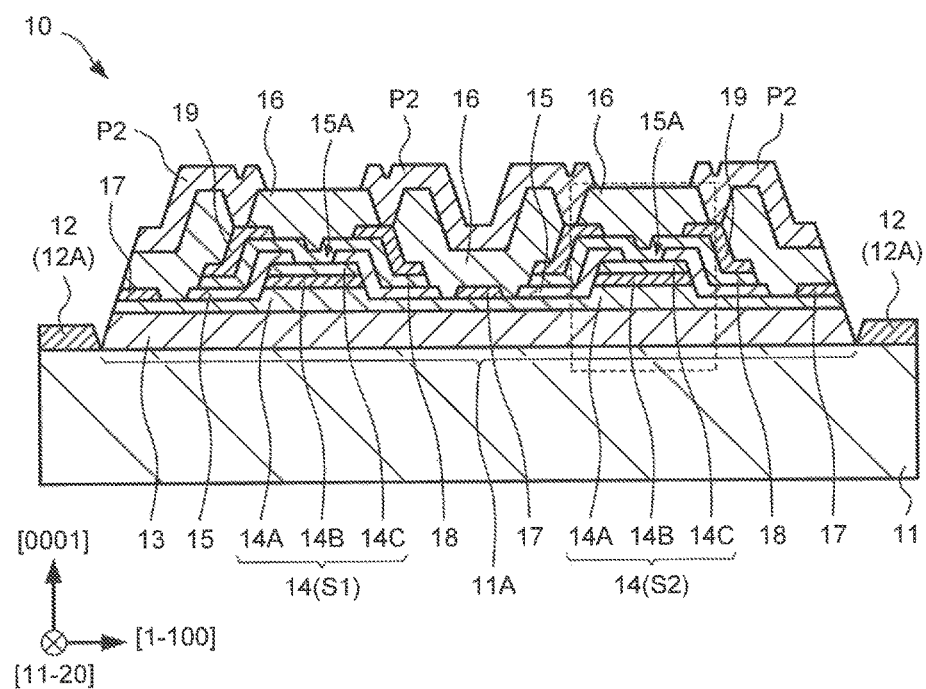
FIG. 1A is a cross-sectional view illustrating a vertical cavity light-emitting device including a reflector according to a first embodiment of the present invention.
Figure 1B:
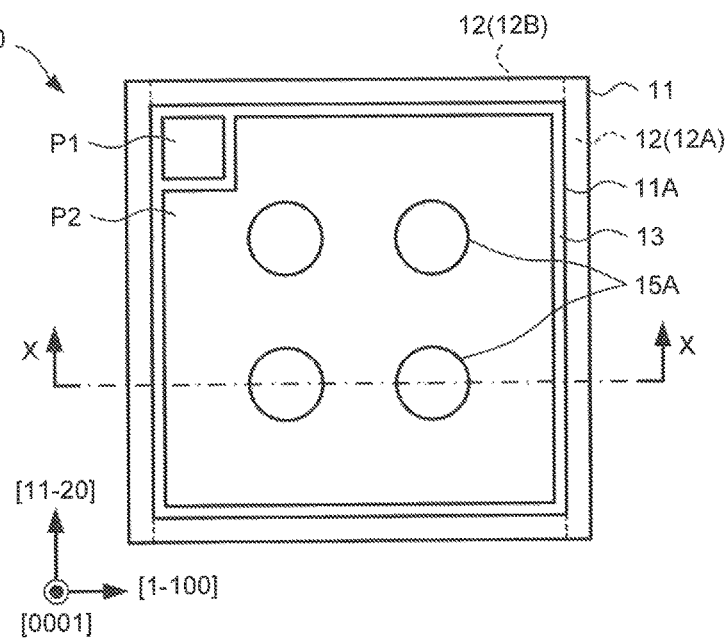
FIG. 1B is a top view of the vertical cavity light-emitting device according to the first embodiment.

FIG. 1A is a cross-sectional view illustrating a vertical cavity light-emitting device (hereinafter referred to simply as a light-emitting device) 10 according to a first embodiment of the present invention. FIG. 1B is a top view of the light-emitting device 10. FIG. 1A is a cross-sectional view taken along line X-X in FIG. 1B. In the present embodiment, the light-emitting device 10 is a vertical cavity surface emitting laser (VCSEL).

The light-emitting device 10 includes a semiconductor substrate 11 having a hexagonal crystal structure. The semiconductor substrate 11 is a GaN substrate, for example. The light-emitting device 10 also includes a line mask 12 that is formed in a linear shape along at least an a-axis direction of the semiconductor substrate 11 on a c-plane ((0001) plane) of the semiconductor substrate 11 and that partially covers the c-plane of the semiconductor substrate 11. The a-axis direction of the semiconductor substrate 11 refers to, for example, a [11-20] direction and directions equivalent thereto. The line mask 12 is formed from an insulating material such as $SiO_2$ or SiN, for example.

As shown in FIG. 1B, the line mask 12 in the present embodiment includes: a pair of line parts 12A extending parallel to each other along the [11-20] direction on the c-plane of the semiconductor substrate 11; and a pair of line parts 12B extending parallel to each other along a [1-100] direction. In the line mask 12, the line part 12A is a portion extending along the a-axis direction, and the line part 12B is a portion extending along a direction perpendicular to the a-axis direction (i.e., an m-axis direction). In the present, embodiment, the line mask 12 as a whole is formed in a frame shape so as to surround the outer periphery of the c-plane of the semiconductor substrate 11.

The light-emitting device 10 also has a structure in which a first reflector 13, a light-emitting structure layer 14, and a second reflector 16 are formed on an exposed region 11A, which is exposed from the line mask 12, on a surface of the semiconductor substrate 11. The second reflector 16 is disposed on the light-emitting structure layer 14 so as to be opposed to the first reflector 13. The first and second reflectors 13 and 16, together with the light-emitting structure layer 14, constitute a vertical cavity having a direction vertical to the semiconductor substrate 11 as a cavity length direction.

In the present embodiment, the exposed region 11A of the semiconductor substrate 11 is a closed region. That is, the line mask 12 is formed in a loop shape so as to surround the exposed region 11A on the c-plane of the semiconductor substrate 11.

In the present embodiment, the first reflector 13 is formed from a semiconductor multi-layer film in which semiconductor films having refractive indices different from each other are alternately layered in a plurality of times. The second reflector 16 is formed from a dielectric multi-layer film in which dielectric films having refractive indices different from each other are alternately layered in a plurality of times. In other words, the first reflector 13 constitutes a distributed Bragg reflector (DBR) formed from the semiconductor materials. The second reflector 16 constitutes a distributed Bragg reflector formed from the dielectric materials.

The light-emitting structure layer 14 includes: an n-type semiconductor layer (first semiconductor layer) 14A, an active layer 14B, and a p-type semiconductor layer (second semiconductor layer, which has a conductivity type opposite to that of the first semiconductor layer) 14C. The light-emitting structure layer 14 has a structure in which the n-type semiconductor layer 14A, the active layer 14B, and the p-type semiconductor layer 14C are sequentially layered in this order on the first reflector 13. For example, the n-type semiconductor layer 14A, the active layer 14B, and the P-type semiconductor layer 14C have a composition of $Al_{x1}In_{y1}Ga_{1-x1-y1}N$ ($0 \le x1 \le 1$, $0 \le y1 \le 1$, $0 \le x1+y1 \le 1$). In the present embodiment, the active layer 14B has a multi-quantum well structure.

In the present embodiment, the light-emitting structure layer 14 includes a plurality of (four in the present embodiment) light-emitting segments. The four light-emitting segments have configurations similar to one another. Of the four light-emitting segments, two light-emitting segments S1 and S2 are shown in FIG. 1A.

In the present embodiment, the light-emitting structure layer 14 is provided with a recess starting from the p-type semiconductor layer 14C and reaching the n-type semiconductor layer 14A completely through the p-type semiconductor layer 14C and the active layer 14B. The light-emitting structure layer 14 is separated (divided) into the light-emitting segments S1 and S2 by the recess. Thus, the n-type semiconductor layer 14A is common to the light-emitting segments S1 and S2, whereas the active layer 14B and the p-type semiconductor layer 14C are separated between the light-emitting segments S1 and S2.

In the present embodiment, each of the light-emitting segments S1 and 32 is interposed between the first and second reflectors 13 and 16 to form the cavity. Thus, the light-emitting device 10 in the present embodiment is a VCSEL array having the four vertical cavities. The light-emitting device 10 also extracts light, which has been emitted from each of the light-emitting segments S1 and S2 and reached to a resonant condition in the cavity, to the outside from the second reflector 16 side.

The light-emitting device 10 also includes: an n-electrode (first electrode) 17 connected to the n-type semiconductor layer 14A in the light-emitting structure layer 14 (each of the light-emitting segments S1 and S2); and a p-electrode (second electrode) 18 connected to the p-type semiconductor layer 14C. The n-electrode 17 is formed on the n-type semiconductor layer 14A. On the p-type semiconductor layer 14C, on the other hand, a current confinement layer 15 having an opening 15A as a current confinement part is provided. The p-electrode 18 is formed on the current confinement layer 15 and connected to (in contact with) the p-type semiconductor layer 14C via the opening 15A.

The current confinement layer 15 is, for example, an insulating layer formed of an insulating material such as $SiO_2$ or SiN. The p-electrode 18 is, for example, a metal oxide film, such as ITO or IZO, transmissive to light emitted from the light-emitting structure layer 14.

A connection electrode 19 is formed on the p-electrode 18 except for a region above the opening 15A of the current confinement layer 15. The second reflector 16 is formed on the region of the p-electrode 18 above the opening 15A of the current confinement layer 15.

In the present embodiment, the light-emitting device 10 also includes: an n-pad (first pad) P1 connected to the n-electrode 17; and a p-pad (second pad) P2 connected to the connection electrode 19. In the present embodiment, the second reflector 16 is formed so as to cover almost the entirety of a region on the n-electrode 17, the light-emitting structure layer 14, the p-electrode 18, and the connection electrode 19. The second reflector 16 includes through holes on part of the region of the n-electrode 17 and on part of the region of the connection electrode 19. The n-pad P1 and the p-pad P2 are formed on the second reflector 16 and connected to the n-electrode 17 and the connection electrode 19, respectively, via the through holes.

Figure 2:
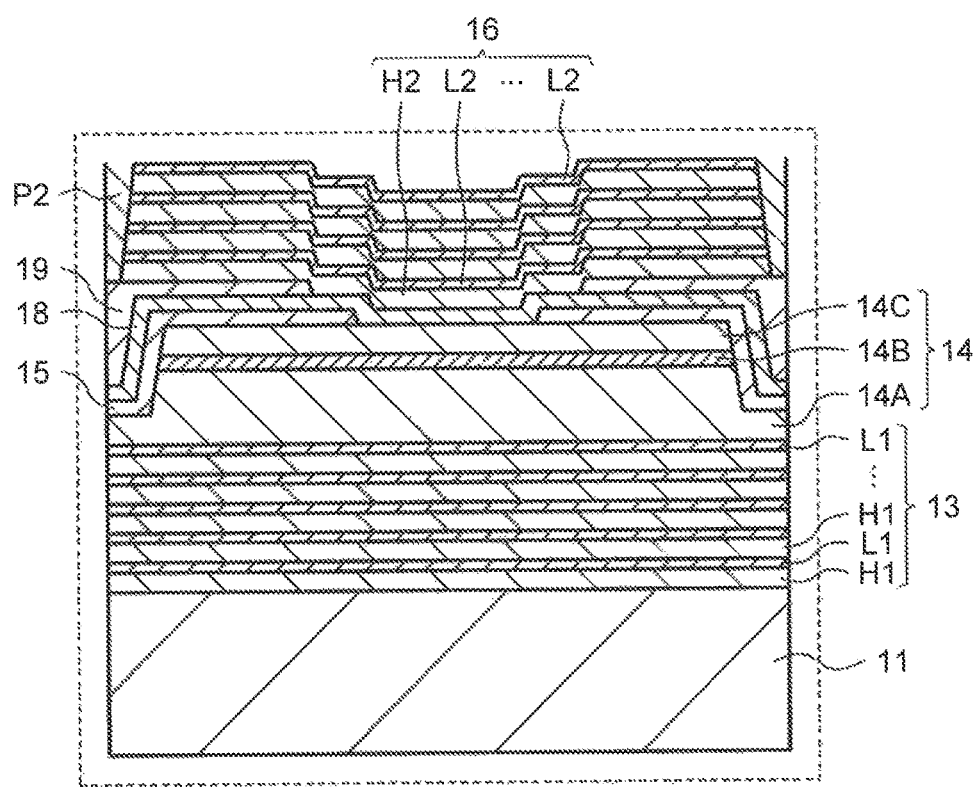
FIG. 2 is a cross-sectional view of the vertical cavity light-emitting device according to the first embodiment.

FIG. 2 is an enlarged cross-sectional view illustrating the light-emitting device 10. FIG. 2 is a cross-sectional view illustrating, in an enlarged manner, a portion surrounded by a broken line in FIG. 1A. Configurations of the first and second reflectors 13 and 16 will be described with reference to FIG. 2.

The first reflector 13 is formed from a semiconductor multi-layer film in which a high refractive index semiconductor film (first semiconductor film) H1 and a low refractive index semiconductor film (second semiconductor film) H1 having a refractive index smaller than that of the high refractive index semiconductor film H1 are alternately layered. The high refractive index semiconductor film H1 and the low refractive index semiconductor film L1 are semiconductor films grown on the exposed region 11A, which is exposed from the line mash 12, on the surface of the semiconductor substrate 11.

The high refractive index semiconductor film H1 and the low refractive index semiconductor film L1 have a composition of $Al_{x2}In_{y2}Ga_{1-x2-y2}N$ ($0 \leq x2 \leq 1$, $0 \leq y2 \leq 1$, $0 \leq x2+y2 \leq 1$). In the present embodiment, the high refractive index semiconductor film H1 has a composition of GaN ($x2=y2=0$). The low refractive index semiconductor film L1 has a composition of AlInN ($0 \leq x2 \leq 1$, $0 \leq y2 \leq 1$, $x2+y2=1$). In the present embodiment, an In composition in the low refractive index semiconductor film L1 is smaller than 18% ($y2<0.18$).

The second reflector 16 has a structure in which a high refractive index dielectric film (first dielectric film) H2 and a low refractive index dielectric film (second dielectric film) L2 having a refractive index smaller than that of the high refractive index dielectric film H2 are alternately layered. The high refractive index dielectric film H2 is formed from $ZrO_2$, and the low refractive index dielectric film L2 is formed from $SiO_2$, for example.

(Method of Producing Light-Emitting Device 10)

Figure 3A:
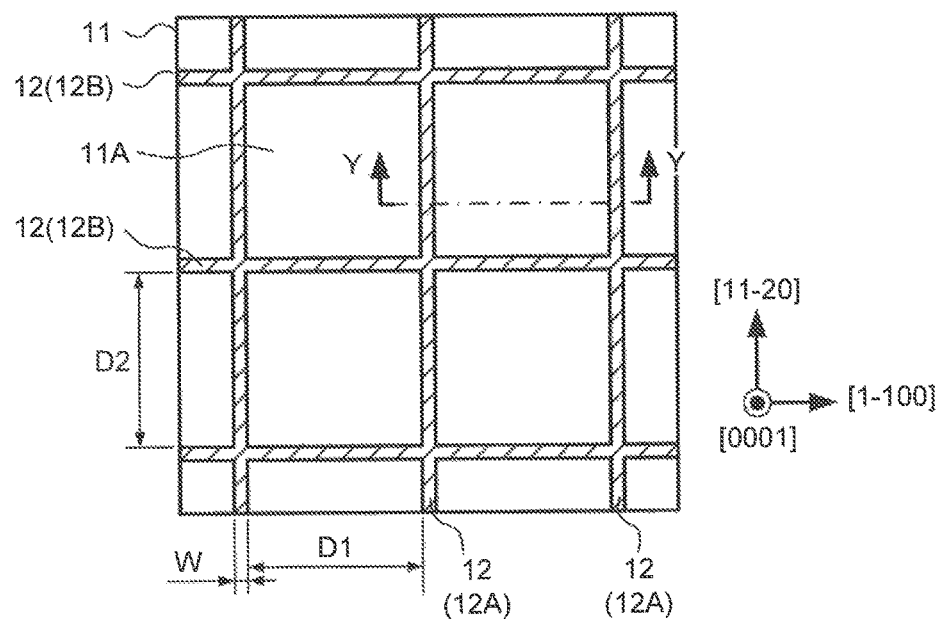
FIGS. 3A and 3B are diagrams showing a production process of the vertical cavity light-emitting device according to the first embodiment.
Figure 3B:
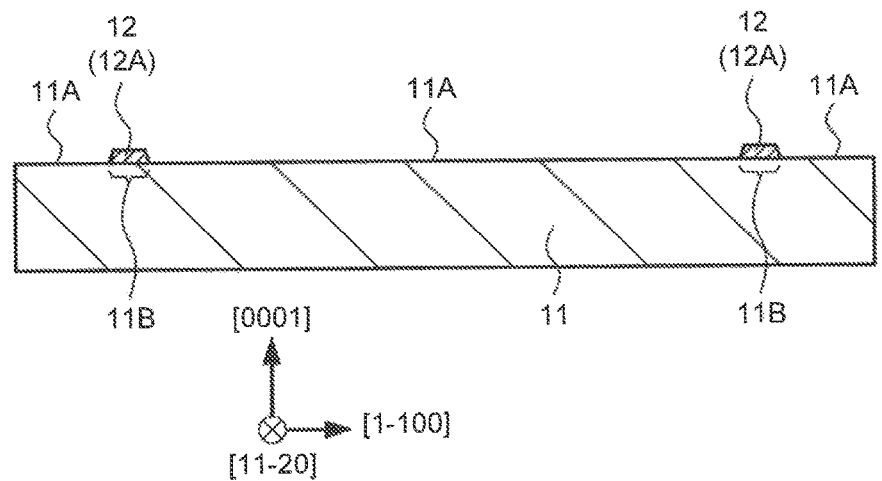
Figure 4A:
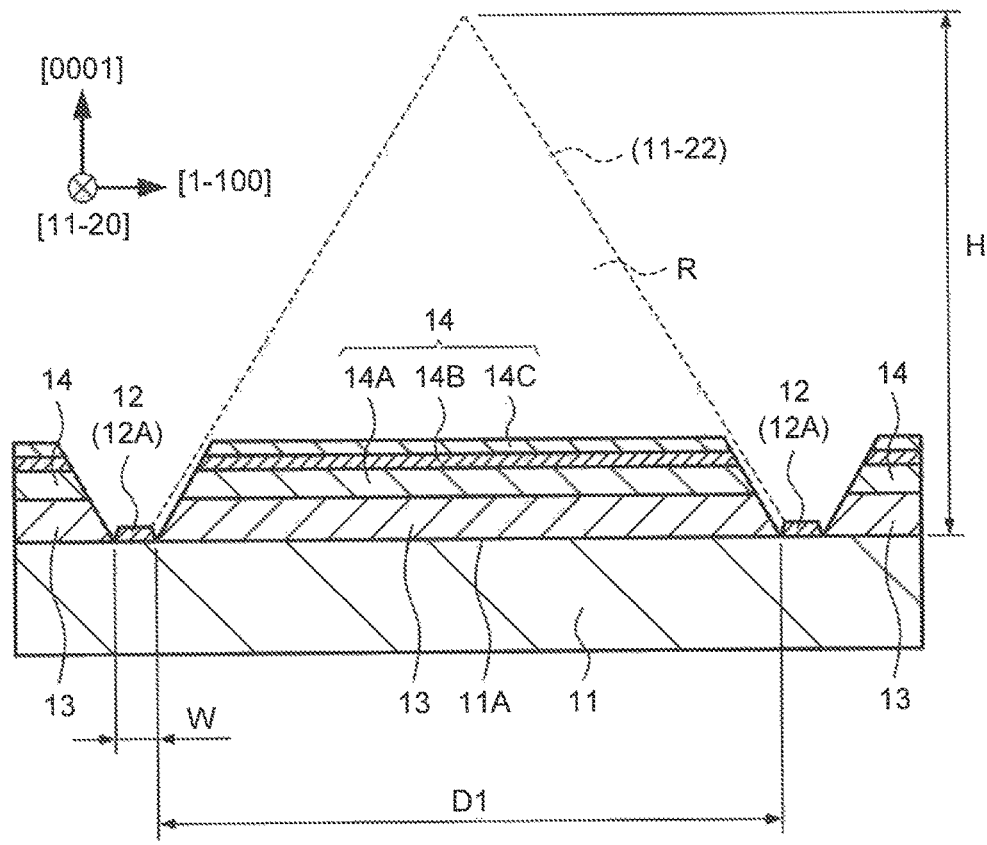
FIG. 4A is a diagram showing the production process of the vertical cavity light-emitting device according to the first embodiment.

A method of producing the light-emitting device 10 will now be described with reference to FIGS. 3A to 5C. FIGS. 3A to 5C are diagrams showing a production process of the light-emitting device 10. Specifically, FIGS. 3A, 3B, and 4A are each a top view or a cross-sectional view illustrating a region of part of a semiconductor wafer to be the semiconductor substrate 11 as well as a region of the light-emitting device 10 and its adjacent region. FIGS. 5A to 5C are cross-sectional views each illustrating a region of the light-emitting device 10 in the semiconductor wafer.

(Formation of Line Mask 12)

FIGS. 3A and 3B are a top view and a cross-sectional view, respectively, illustrating the semiconductor substrate 11 on which the line mask 12 is formed. FIG. 3B is a cross-sectional view taken along line Y-Y in FIG. 3A. In FIG. 3A, the region of the line mask 12 is hatched for the purpose of clarity. First, the line mask 12 extending linearly along at least the a-axis direction of the semiconductor substrate 11 is formed on the c-plane of the semiconductor substrate 11 having a hexagonal crystal structure. An insulating film such as $SiO_2$ can be used as the line mask 12, for example.

In the present embodiment, a plurality of line parts 12A extending along the [11-20] direction (i.e. a-axis direction) and disposed at equal intervals and a plurality of line parts 12B extending along the [1-100] direction and disposed at equal intervals are formed as the line mask 12 on the (0001) plane of the GaN substrate as the semiconductor substrate 11.

As shown in FIG. 3A, the [11-20] direction and the [1-100] direction are directions perpendicular to each other. Thus, a mask patterned in a quadrangular grid shape is formed on the c-plane of the semiconductor substrate 11 as the line mask 12 in the present embodiment.

As shown in FIG. 3B, the formation of the line mask 12 creates the exposed region 11A exposed from the line mask 12 and a covered region 11B covered with the line mask 12 on the surface of the semiconductor substrate 11. The exposed region 11A serves as a crystal growth region in the semiconductor substrate 11, whereas the covered region 11B serves as a non-crystal growth region.

In the present embodiment, a plurality of rectangular exposed regions 11A are provided on the semiconductor substrate 11. Lengths D1 and D2 of the exposed region 11A, i.e., an interval between adjacent line parts 12A and an interval between adjacent line parts 12B, are set within a range of 1 to 3 mm, for example. A line width W of the line mask 12, i.e., a width of each of the line parts 12A and 12B, is set within a range of 1 to 30 μm, for example.

(Formation of First Reflector 13 and Light-Emitting Structure Layer 14)

FIG. 4A is a cross-sectional view illustrating the semiconductor substrate 11 on which the first reflector 13 and the light-emitting structure layer 14 are formed. Next, the first reflector 13 is formed by alternately growing a plurality of semiconductor films having refractive indices different from each other on the exposed region 11A of the semiconductor substrate 11 that is exposed from the line mash 12. In the present embodiment, the high refractive index semiconductor film H1 and the low refractive index semiconductor film L1 (see FIG. 2) are grown alternately in a plurality of times on the exposed region 11A to form a semiconductor multi-layer film. In this manner, the first reflector 13 is formed.

In the present embodiment, the semiconductor films H1 and L1 of the first reflector 13 are grown only from the exposed region 11A of the semiconductor substrate 11 that is exposed from the line mask 12. That is, no semiconductor films H1 and L1 are grown from the covered region 11B covered with the line mask 12. Thus, the first reflector 13 is separated by the covered regions 11B of the line mask 12 as shown in FIGS. 3B and 4A.

The first reflector 13 will now be described. In the present embodiment, GaN is used as the high refractive index semiconductor film H1, and AlInN is used as the low refractive index semiconductor film L1. The present inventors have focused on a fact that cracks are more likely to develop along the a-axis direction when a semiconductor multi-layer film is formed by growing GaN and AlInN on the c-plane of the AlInN substrate.

Specifically, a difference between lattice constants of GaN and AlInN the a-axis direction is larger than those in any other directions. Thus, when a GaN film and an AlInN film are grown, larger internal strain is generated in the a-axis direction than in any other directions. This may lead to the development of many cracks along the a-axis direction.

Figure 4B:
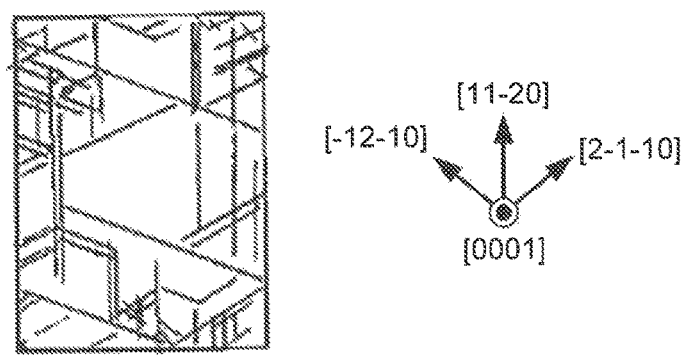
FIG. 4B is a sketch illustrating cracks formed on a surface of a reflector in a light-emitting device according to a comparative example.

FIG. 4B is a sketch illustrating cracks, in a light-emitting device (i.e. comparative example) in which a semiconductor multi-layer film reflector similar to the first reflector 13 is formed without forming the line mask 12, developed on a surface of the reflector. As shown in FIG. 4B, most cracks are developed along the a-axis direction, i.e., the [11-20] direction, a [-12-10] direction, and a [2-1-10] direction.

In the present embodiment, on the other hand, the line mask 12 is formed along the [11-20] direction, which is one of the a-axis directions, and thus no semiconductor films are grown from the covered region 11B of the line mask 12 in the semiconductor substrate 11. Consequently, the propagation of the internal strain generated in the a-axis direction in the GaN film and the AlInN film can be stopped by the covered regions 11B of the line mask 12. Thus, the first reflector 13 can be a multi-layer film reflector formed from high-quality semiconductor films with less cracks.

In the present embodiment, the AlInN film used as the low refractive index semiconductor film L1 preferably has an In composition of less than 18%. Specifically, GaN and AlInN have lattice constants comparable with each other when the In composition is at 18%. Therefore, in view of prioritizing lattice match, the generation of strain due to lattice mismatch can be suppressed when a GaN film is used as the high refractive index semiconductor film H1 and an $Al_{0.82}In_{0.18}N$ film is used as the low refractive index semiconductor film L1 to form a multi-layer film reflector. In view of increasing a difference between their refractive indices, i.e., obtaining a desired reflectance with a smaller number of layered films, a smaller in composition is more preferred.

In the present embodiment, the development of cracks can be suppressed by the formation of the line mask 12 even when AlInN with an In composition of less than 18% and GaN, which have a lattice mismatch relationship, are used to form the reflector. Thus, the reflector (DBR) 13 formed from the semiconductor films having high film quality and having a high reflectance with a smaller number of layered films can be formed.

Next, the n-type semiconductor layer 14A, the active layer 14B, and the p-type semiconductor layer 14C are grown on the first reflector 13 to form the light-emitting structure layer 14 as shown in FIG. 4A. In the present embodiment, an n-GaN layer is grown as the n-type semiconductor layer 14A. An active layer having a multi-quantum well structure including a GaN layer and an InGaN layer is grown as the active layer 14B. A p-GaN layer is grown as the p-type semiconductor layer 14C.

A growth region of the first reflector 13 and the light-emitting structure layer 14 will now be described. As shown in FIG. 4A, the first reflector 13 and the light-emitting structure layer 14 are formed in a pyramidal region R having the exposed region 11A, which is exposed from the line mask 12, on the surface of the semiconductor substrate 11 as a base.

The pyramidal region R is a region surrounded by a (11-22) plane and a plane equivalent to the (11-22) plane passing through the line mask 12. Specifically, the pyramidal region R is a region (space) surrounded by the (11-22) plane and the plane equivalent to the (11-22) plane including side edges of a pair of line parts 12A as shown in FIG. 4A, for example.

In the present embodiment, the side edge of idle line part 12A constituting the pyramidal region R refers to an inner side edge of an adjacent line part 12A, e.g., one of side edges extending in the [11-20] direction in one of the line parts 12A that is closer to the other one of the line parts 12A.

In the present embodiment, the exposed region 11A is a rectangular region on the surface of the semiconductor substrate 11 surrounded by two adjacent line parts 12A and two adjacent line parts 12B. The pyramidal region R is a quadrangular pyramid region having the exposed region 11A as a base. Note that a width and a length of the base of the pyramidal region R (the lengths D1 and D2 of the exposed region 11A) fall within a range of 1 to 3 mm, and a height H of the pyramidal region R falls within a range of 0.8 to 2.4 mm.

The pyramidal region R provided on the semiconductor substrate 11 by the line mask 12 serves a low-crack region when semiconductors are grown therein. Thus, the first reflector 13 and the light-emitting structure layer 14 grown (formed) in the pyramidal region R are formed from high-quality semiconductor films (semiconductor layers) with fewer cracks. In the present embodiment, the first reflector 13 and the light-emitting structure layer 14 form a truncated pyramid shape in the pyramidal region R.

(Division of Light-Emitting Structure Layer 14 and Formation of Current Confinement Layer 15)

FIG. 5A is a diagram illustrating the semiconductor substrate 11 on which the light-emitting structure layer 14 is divided for each of the light-emitting segments S1 and S2. Note that FIGS. 5A to 5C each show only a region to be the light-emitting device 10. In the present embodiment, after the light-emitting structure layer 14 is grown, recesses RC are formed in the light-emitting structure layer 14 so as to divide the light-emitting structure layer 14 into a plurality of light-emitting segments including the light-emitting segments S1 and S2.

In the present embodiment, the recesses RC starting from a surface of the p-type semiconductor layer 14C and reaching the n-type semiconductor layer 14A completely through the p-type semiconductor layer 14C and the active layer 14B are formed to separate the p-type semiconductor layer 14C and the active layer 14B for each of the light-emitting segments S1 and S2. In the present embodiment, the light-emitting segments S1 and S2 having a truncated cone shape are formed.

Next, in each of the divided light-emitting segments S1 and 32, the current confinement layer 15 having an opening as a current confinement part 15A is formed as shown in FIG. 5B. In the present embodiment, for each of the light-emitting segments S1 and S2, an insulating layer formed from $SiO_2$ is formed as the current confinement layer 15 on side surfaces of the active layer 14B and the p-type semiconductor layer 14C, which serve as the light-emitting segments S1 and S2, and on part of a bottom surface of the recess RC in the n-type semiconductor layer 14A. A circular opening is formed as the current confinement part 15A on an upper surface of the p-type semiconductor layer 14C.

(Formation of Second Reflector 16, Electrodes, and Pads, and Singulation)

FIG. 5C is a diagram illustrating the semiconductor substrate 11 provided with the second reflector 16, the electrodes, etc., and singulated (i.e. divided) into a single light-emitting device 10. Next, in the present embodiment, the p-electrode 18 is formed on the current confinement layer 15, and the n-electrode 17 is formed on the n-type semiconductor layer 14A. In the present embodiment, the p-electrode 18 is formed on the current confinement layer 15 so as to bury the opening as the current confinement part 15A. The n-electrode 17 is formed on a surface of the n-type semiconductor layer 14A exposed from the current confinement layer 15.

Next, the connection electrode 19 is formed in a region on the p-electrode 18 excluding the region on the current confinement part 15A. In the present embodiment, the connection electrode 19 is formed on the p-electrode 18 so as to surround the current confinement part 15A as viewed from the above.

Subsequently, the second reflector 16 is formed at a position on the light-emitting structure layer 14 that is opposed to the first reflector 13. In the present embodiment, the second reflector 16 is formed on a surface of the p-electrode 18. In the present embodiment, the second reflector 16 is formed by alternately layering the high refractive index dielectric film H2 and the low refractive index dielectric film L2 so as to cover almost the entirety of the light-emitting structure layer 14, the n-electrode 17, the p-electrode 18, and the connection electrode 19.

Next, the n-pad P1 connected to the n-electrode 17 and the p-pad P2 connected to the connection electrode 19 are formed. In the present embodiment, a through hole reaching the connection electrode 19 is formed in a region of the second reflector 16 on the connection electrode 19, and the p-pad P2 connected to the connection electrode 19 via the through hole is formed. Part of the second reflector 16 on the n-electrode 17 is removed to expose the n-electrode 17, and the n-pad P1 is formed so as to cover the exposed, n-electrode 17.

Note that the n-pad P1 and the p-pad P2 are common to the light-emitting segments S1 and S2 in the present embodiment.

Thereafter, the semiconductor substrate 11 is cut on the line mask 12 so as to singulate the semiconductor substrate 11 into the light-emitting devices 10. Thereafter, the semiconductor substrate 11 is fixed onto a mounting substrate, wire bonding to the n-pad P1 and the p-pad P2 is performed, and sealing is performed to complete the light-emitting device 10.

As described above, in the present embodiment, the line mask 12 extending along the a-axis direction is formed on the c-plane of the semiconductor substrate 11, and the first reflector 13 and the light-emitting structure layer 14 are grown on the exposed region 11A of the semiconductor substrate 11 that is exposed from the line mask 12. Consequently, the development of cracks during the growth of the first reflector 13 can be suppressed without additionally configuring complicated condition settings, and the semiconductor multi-layer film formed from high-quality semiconductor films and having a high reflectance can be thus formed.

When a plurality of light-emitting segments are provided as in the light-emitting device 10, the formation of the high-quality first reflector 13 can reduce variations in emission intensity among the segments, and the productivity is therefore improved.

Second Embodiment

Figure 6A:
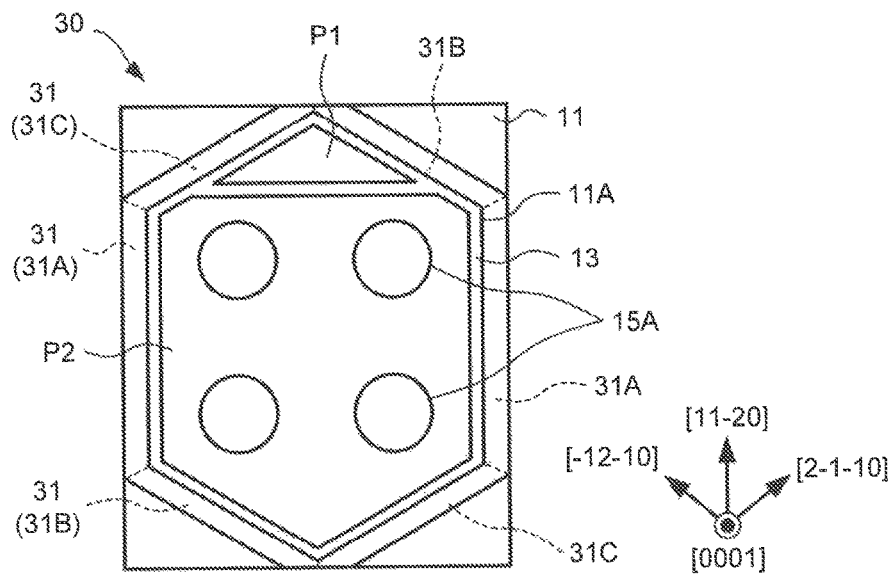
FIG. 6A is a top view illustrating a vertical cavity light-emitting device including a reflector according to a second embodiment of the present invention.

FIG. 6A is a top view of a light-emitting device 30 according to a second embodiment of the present invention. The light-emitting device 30 has a configuration similar to the light-emitting device 10 except for the configuration of a line mask 31. In the present embodiment, the line mask 31 extends linearly in a-axis directions, i.e., the [11-20] direction, the [-12-10] direction, and the [2-1-10] direction on a c-plane of a semiconductor substrate 11. The line mask 31 is disposed so as to form hexagonal sides as a whole.

Specifically, the line mask 31 includes: a pair of line parts 31A extending along the [11-20] direction; a pair of line parts 31B extending along the [-12-10] direction; and a pair of line parts 31C extending along the [2-1-10] direction. The line mask 31 is disposed so as to form a hexagonal closed exposed region 11A on the c-plane of the semiconductor substrate 11.

Figure 6B:
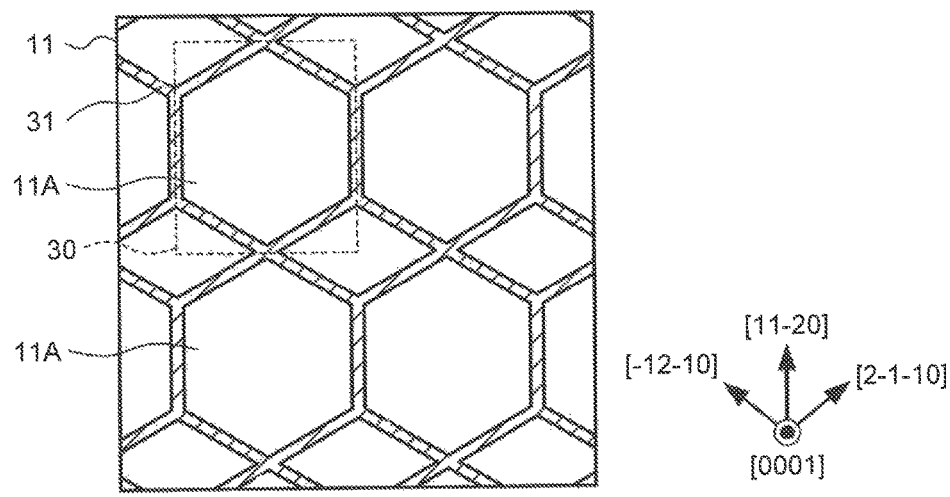
FIG. 6B is a diagram illustrating a production process of the vertical cavity light-emitting device according to the second embodiment.

A method of producing the light-emitting device 30 will be described with reference to FIG. 6B. FIG. 6B is a top view illustrating the semiconductor substrate 11 on which the line mask 31 as formed. The region of the line mask 31 is hatched for the purpose of clarity. The light-emitting device 30 can be produced, for example, by forming the line mask 31 extending linearly along the [11-20] direction and the directions equivalent to the [11-20] direction on the c-plane of the semiconductor substrate 11 and then growing a first reflector 13, a light-emitting structure layer 14, etc., on the exposed region 11A. In FIG. 6B, a region to be singulated as a region of the light-emitting device 30 is shown by a broken line.

In the present embodiment, the light-emitting device 30 includes the line mask 31 extending along the a-axis directions of the semiconductor substrate 11. That is, the line mask 31 for suppressing the development of cracks is provided in all directions along which cracks are more likely to develop. Consequently, the development of cracks is suppressed during the growth of the first reflector 13, and a semiconductor multi-layer film formed from semiconductor films having high film quality is thus formed. Moreover, the first reflector 13 can be a reflector having a high reflectance. The light-emitting device 30 including the semiconductor multi-layer film reflector, which achieves a desired reflectance with a smaller number of layered films, can thus be provided.

While the case where the light-emitting devices 10 and 30 extract light from the second reflector 16 side has been described above, light may be extracted from the first reflector 13 side. That is, the light-emitting device 10 or 30 may have a configuration in which light is extracted from the first reflector 13 side via the semiconductor substrate 11. In this case, the light-emitting device 10 or 30 may be mounted onto the mounting substrate from the second reflector 16 side (the p-pad P2 side) by flip-chip mounting.

While the case where the line masks 12 and 31 are disposed so as to form the closed exposed region 11A on the semiconductor substrate 11 has been described in the above embodiments, the configurations of the line masks 12 and 31 are not limited thereto. For example, the line mask 12 may be formed discontinuously. For example, the line mask 12 only needs to extend linearly along at least one of the [11-20] direction and the directions equivalent to the [11-20] direction on the c-plane of the semiconductor substrate 11 having a hexagonal crystal structure.

The case where the present invention is implemented as the light-emitting device 10 or 30 and the method of producing the same has been described in the above embodiments. The present invention, however, can be implemented also as a reflector (distributed Bragg reflector) including not the light-emitting structure layer 14, the second reflector 16, the electrodes, etc., but the semiconductor substrate 11, the line mask 12 or 31, and the first reflector 13.

More specifically, a configuration example of the reflector according to the present invention may include the semiconductor substrate 11, the line mask 12 or 31, and the semiconductor multi-layer film in which the high refractive index semiconductor film H1 and the low refractive index semiconductor film L1 are alternately layered. The high refractive index semiconductor film H1 and the low refractive index semiconductor film L1 formed in a region on the c-plane of the semiconductor substrate 11 that is exposed from the line mask 12, for example, are high-quality semiconductor films with less cracks. Such semiconductor films constitute a highly reflective reflector that can be used not only as a reflector of a surface emitting laser but also for various applications.

This application is based on a Japanese Patent Application No. 2016-207598 which is hereby incorporated by reference.

What is claimed is:

1. A vertical cavity light-emitting device comprising:
    a semiconductor substrate having a hexagonal crystal structure;
    a line mask extending linearly along at least a [11-20] direction, a [-12-10] direction, and a [2-1-10] direction on a c-plane of the semiconductor substrate;
    a first reflector formed on an exposed region exposed from the line mask on the c-plane of the semiconductor substrate, the first reflector comprising a high refractive index semiconductor film and a low refractive index semiconductor film having a refractive index smaller than that of the high refractive index semiconductor film, the high refractive index semiconductor film and the low refractive index semiconductor film being alternately layered;
    a light-emitting structure layer formed on the first reflector; and
    a second reflector disposed on the light-emitting structure layer so as to be opposed to the first reflector.

2. The vertical cavity light-emitting device according to claim 1, wherein:
    the line mask includes a pair of line parts extending parallel to each other along one of the [11-20] direction and directions equivalent to the [11-20] direction, and
    the first reflector is formed on the exposed region of the semiconductor substrate between the pair of line parts.

3. The vertical cavity light-emitting device according to claim 2, wherein the first reflector and the light-emitting structure layer are formed in a region surrounded by a (11-22) plane and a plane equivalent to the (11-22) plane including side edges of the pair of line parts.

4. The vertical cavity light-emitting device according to claim 1, wherein the line mask is formed so as to surround the exposed region on the c-plane of the semiconductor substrate.

5. The vertical cavity light-emitting device according to claim 1, wherein:
    the semiconductor substrate is a GaN substrate,
    the high refractive index semiconductor film is a GaN film, and the low refractive index semiconductor film is an AlInN film, and
    an In composition of the AlInN film is less than 18%.

6. A method of producing the vertical cavity light-emitting device according to claim 1, comprising:
    forming the line mask to extend linearly along at least the [11-20] direction, the [-12-10] direction, and the [2-1-10] direction on the c-plane of the semiconductor substrate having the hexagonal crystal structure;
    forming the first reflector by alternately growing the high refractive index semiconductor film and the low refractive index semiconductor film having the refractive index smaller than that of the high refractive index semiconductor film on the exposed region exposed from the line mask on the c-plane of the semiconductor substrate;
    growing the light-emitting structure layer on the first reflector; and
    forming the second reflector at a position on the light-emitting structure layer that is opposed to the first reflector.

7. The method according to claim 6, wherein the line mask is formed on the c-plane of the semiconductor such that the line mask includes a pair of line parts extending parallel to each other along one of the [11-20] direction and directions equivalent to the [11-20] direction.

8. The method according to claim 7, wherein the first reflector is grown in a region surrounded by a (11-22) plane and a plane equivalent to the (11-22) plane including side edges of the pair of line parts.

9. The method according to claim 6, wherein further comprising forming a recess to divide the light-emitting structure layer into a plurality of light-emitting segments.

10. The method according to claim 6, wherein:
    the semiconductor substrate is a GaN substrate,
    the high refractive index semiconductor film is a GaN film, and
    the low refractive index semiconductor film is an AlInN film.

* * * * *